United States Patent
Catthoor et al.

(10) Patent No.: US 9,899,086 B2
(45) Date of Patent: Feb. 20, 2018

(54) METHOD AND DEVICE TO REDUCE LEAKAGE AND DYNAMIC ENERGY CONSUMPTION IN HIGH-SPEED MEMORIES

(71) Applicant: IMEC, Leuven (BE)

(72) Inventors: Francky Catthoor, Temse (BE); Komalan Manu Perumkunnil, Kidangannur (BE); Stefan Cosemans, Mol (BE)

(73) Assignee: IMEC, Leuven (BE)

( * ) Notice: Subject to any disclaimer, the term of this patent is extended or adjusted under 35 U.S.C. 154(b) by 747 days.

(21) Appl. No.: 14/163,666

(22) Filed: Jan. 24, 2014

(65) Prior Publication Data
US 2014/0289457 A1 Sep. 25, 2014

Related U.S. Application Data

(63) Continuation of application No. PCT/EP2012/064349, filed on Jul. 20, 2012.
(Continued)

(51) Int. Cl.
*G06F 12/00* (2006.01)
*G11C 14/00* (2006.01)
(Continued)

(52) U.S. Cl.
CPC ........ *G11C 14/009* (2013.01); *G06F 12/0246* (2013.01); *G06F 12/0893* (2013.01);
(Continued)

(58) Field of Classification Search
CPC .............. G11C 14/009; G11C 13/0002; G06F 2212/1028; G06F 2212/2024;
(Continued)

(56) References Cited

U.S. PATENT DOCUMENTS

| | | | |
|---|---|---|---|
| 7,694,084 B2 | 4/2010 | Raghavan et al. | |
| 2006/0212685 A1* | 9/2006 | Raghavan | G06F 9/30036 712/225 |

(Continued)

FOREIGN PATENT DOCUMENTS

WO  WO 2013/014111  1/2013

OTHER PUBLICATIONS

Catthoor et al., "An Asymmetrical Register File: The VWR," *Ultra-low energy domain-specific instruction-set processors*, chapter 8; Jun. 2010; pp. 187-210.
(Continued)

*Primary Examiner* — Kalpit Parikh
(74) *Attorney, Agent, or Firm* — Knobbe Martens Olson & Bear LLP

(57) ABSTRACT

A microcomputer comprising a microprocessor unit and a first memory unit is disclosed. In one aspect, the microprocessor unit comprises at least one functional unit and at least one register. Further, the at least one register is a wide register comprising a plurality of second memory units which are capable to each contain one word, the wide register being adapted so that the second memory units are simultaneously accessible by the first memory unit, and at least part of the second memory units are separately accessible by the at least one functional unit. Further, the first memory unit is an embedded non-volatile memory unit.

19 Claims, 9 Drawing Sheets

Related U.S. Application Data

(60) Provisional application No. 61/511,946, filed on Jul. 26, 2011.

(51) Int. Cl.
*G06F 12/0893* (2016.01)
*G06F 12/0897* (2016.01)
*G06F 12/02* (2006.01)
*G11C 13/00* (2006.01)

(52) U.S. Cl.
CPC .. *G06F 12/0897* (2013.01); *G06F 2212/1028* (2013.01); *G06F 2212/2024* (2013.01); *G06F 2212/222* (2013.01); *G06F 2212/454* (2013.01); *G06F 2212/7201* (2013.01); *G11C 13/0002* (2013.01); *Y02B 60/1225* (2013.01)

(58) Field of Classification Search
CPC ......... G06F 2212/222; G06F 2212/454; G06F 2212/7201; G06F 12/0893; G06F 12/0897; Y02B 60/1225
See application file for complete search history.

(56) References Cited

U.S. PATENT DOCUMENTS

| | | | |
|---|---|---|---|
| 2008/0294882 A1 | 11/2008 | Jayapala et al. | |
| 2010/0095057 A1 | 4/2010 | Li et al. | |
| 2012/0063196 A1* | 3/2012 | Kim | G11C 13/0004 365/148 |

OTHER PUBLICATIONS

Chen et al., "Processor Caches Built Using Multi-Level Spin-Transfer Torque RAM Cells," *International Symposium on Low Power Electronics and Design (ISPLED)*; Aug. 2011; 6 pgs.

Cosemans et al., "A 3.6 pJ/Access 480 MHz, 128 kb On-Chip SRAM With 850 MHz Boost Mode in 90 nm CMOS With Tunable Sense Amplifiers," *IEEE Journal of Solid-State Circuits*; vol. 44, No. 7; Jul. 2009; pp. 2065-2077.

Cosemans, "Variability-aware design of low power SRAM memories—modified version Oct. 11, 2010," Ph.D. Thesis of Stefan Cosemans, Katholieke Universiteit Leuven, chapters 4-5; May 2009; 70 pgs.

Guo et al., "Resistive Computation: Avoiding the Power Wall with Low-Leakage, STT-MRAM Based Computing," *ACM SIGARCH Computer Architecture News*; vol. 38, No. 3, Jun. 2010; pp. 371-382.

Hu et al., "Towards Energy Efficient Hybrid On-chip Scratch Pad Memory with Non-Volatile Memory," *Design, Automation & Test in Europe Conference & Exhibition*; 2011; 6 pgs.

Karandikar et al., "Low Power SRAM Design using Hierarchical Divided Bit-Line Approach," *Computer Design: VLSI in Computers and Processors*; Oct. 1998; pp. 82-88.

Lambrechts et al.,"Design Style Case Study for Embedded Multi Media Compute Nodes," *Proceedings of the 25th IEEE International Real-Time Systems Symposium*; 2004; 10 pgs.

Smullen et al., "Relaxing Non-Volatility for Fast and Energy-Efficient STT-RAM Caches," *IEEE 17th International Symposium on High Performance Computer Architecture (HPCA)*; Feb. 2011; pp. 50-61.

Venkatesan et al., "Energy Efficient Many-core Processor for Recognition and Mining using Spin-based Memory," *Proceedings of the 2011 IEEE/ACM International Symposium on Nanoscale Architectures*; 2011; pp. 122-128.

International Search Report and Written Opinion dated Nov. 5, 2012 for International Patent Application No. PCT/EP2012/064349.

\* cited by examiner

METHOD AND DEVICE TO REDUCE LEAKAGE AND DYNAMIC ENERGY CONSUMPTION IN HIGH-SPEED MEMORIES

CROSS REFERENCE TO RELATED APPLICATIONS

This application is a continuation of PCT Application No. PCT/EP2012/064349, filed Jul. 20, 2012, which claims priority under 35 U.S.C. § 119(e) to U.S. Provisional Patent Application No. 61/511,946, filed Jul. 26, 2011. Each of the above applications is hereby incorporated by reference in its entirety.

BACKGROUND

1. Technological Field

The present invention is related to techniques to deploy memory technologies in processor architectures to reduce leakage and dynamic energy consumption. More specifically, the present invention relates to the use of non-volatile memories in processor architectures to reduce the total leakage and dynamic energy, while meeting stringent performance requirements.

2. Description of the Related Technology

Modern processor architectures nowadays have at least two caches and a local memory (e.g. scratch pad memory): an instruction cache to speed up executable instruction fetch, a data cache to speed up data fetch and store, and optionally a translation lookaside buffer (TLB) used to speed up virtual-to-physical address translation for both executable instructions and data. Data cache is usually organized as a hierarchy of more cache levels (L1, L2, etc.).

L1 data memory (L1D) in today's processors is based on SRAMs and these are (too) energy-inefficient, both from a dynamic and leakage energy perspective. For register-based implementations the challenge is even bigger. Especially the active leakage contribution is an issue because standby leakage can be largely mitigated by recent state-of-the-art techniques ('localized' soft or hard power gating approaches are promising solutions for the future). The L1D layer has to supply data at the processor clock speed (or maximally 2× slower), being for example around 1 ns. This is true both for read and write operations. Moreover, sensitivity to substrate (e.g. silicon) area is still present, even though the memory sizes are quite limited. Due to the inefficiency of SRAMs, a further area reduction would be welcome.

Until today, all industrial and practically realizable compute platforms have used SRAMs or register-based L1D memories. A feasible non-volatile memory solution from an integrated technology-circuit-architecture-mapping point of view where SRAM is avoided for all vector data read and write operations, has not been published. Academic work has focused on a partial replacement of SRAM only, as summarized below.

Jingtong Hu, et al. provide in "*Towards Energy Efficient Hybrid On-chip Scratch Pad Memory with Non-Volatile Memory*" (DATE conference 2011) a solution to the leakage energy consumption problems in scratch pad memories. In this publication, a novel hybrid scratch pad memory is proposed which consists of both non-volatile memories and SRAM. This solution takes advantage of the low leakage power and the high density of non-volatile memories and the energy efficient writes of SRAM. Apart from that, an optimal dynamic data management algorithm is proposed to realize the full potential of both the SRAM and the non-volatile memories.

In the above-mentioned document by J. Hu a technique is provided to reduce the leakage energy consumption in memories. However, they do not provide a solution whereby all SRAM memory accesses for vector data (i.e. all memory accesses which are nested loop related) can be replaced by non-volatile memories to remove the energy leaking problem of SRAM. This solution requires area as a combination of SRAM and non-volatile memory (NVM). Until today, instruction background memory at the intermediate storage level (L1I) is always selected as SRAM as the speed of NVM is not sufficient. Only for the program memory (off-chip) typically a flash device is selected.

A particularly interesting application field wherein the above-mentioned issues are relevant, relates to low power embedded systems for wireless/multimedia target applications. Embedded memories have been increasingly dominating System on Chip (SoC) designs in terms of chip area, performance, power consumption, and manufacturing yield. In many of the commercially available embedded systems today, the Instructions Memory Organization (IMO) consists of two levels: L1I and L0I. The L1I memory is comparatively larger than the L0I (about 8 to 16 times) and the L0I is closer to the data-path. The L0I is commonly implemented as a loop buffer/loop cache, as embedded instruction memories for low power wireless or multimedia applications typically have loop dominated codes.

When envisaging wireless/multimedia target applications, the use of Coarse Grained Reconfigurable Architectures (CGRAs) is appealing. CGRAs exploit the data flow dominance and offer more parallel resources. These architectures usually include a general purpose processor (either RISC based or VLIW) along with a reconfigurable array of cells which speeds up data flow based computations significantly. Programming the cell matrix requires specific memory organizations that efficiently enforce compiler decisions for every cell. This usually implies reading/writing very wide words from memory.

The paper '*Energy Efficient Many-core Processor for Recognition and Mining using Spin-based Memory*' (R. Venkatesan et al., IEEE Int'l Symp. on Nanoscale Architectures, June 2011, pp. 122-128) describes a specific processor that has cache-memory completely consisting of non-volatile memory. The use of Spin Transfer Torque Magnetic RAM (STT-MRAM) is proposed for one of the L2 layer levels and Domain Wall Memory (DWM), a streaming access memory, for the L1 cache level. This memory requires additional shift operations to enable sharing of the read and write ports to multiple domains. However, for wireless/multimedia applications, such memory organization is not efficient.

In '*Relaxing Non-Volatility for Fast and Energy-Efficient STT-RAM Caches*' (Smullen et al, IEEE Int'l Symp. on HPCA, February 2011, pp. 50-61) a design is described using only non-volatile memory (NVM) for cache memory. The NVM is STT-RAM. For optimal performance the properties of the STT-RAM are tuned, especially by relaxing the non-volatility. A refresh policy might be needed to hold the non-volatility. For wireless/multimedia applications such a refresh policy would however be detrimental.

The paper '*Resistive Computation: Avoiding the Power Wall with Low-Leakage, STT-MRAM Based Computing*' (Xiaochen Guo et al.) presents a processor architecture in which most of the functionality is migrated from CMOS to STT-MRAM. Among others the L1I cache and the L1D cache are replaced by STT-MRAM. The authors claim there are no write endurance problems with STT-MRAM: for the SRAM replacement the write latency is assumed to be mitigated by a pure hardware based solution requiring extra read and compare operations whenever a write happens. Such latency is not allowable for the applications envisaged in the present invention.

U.S. Patent Publication No. US2010/0095057 discloses a non-volatile resistive sense memory on-chip cache. However, the document only describes the use of such memory for. L2 or L3 cache. The L1 cache memory is not replaced by non-volatile memory.

The issues of leakage and dynamic energy consumption are for example of particular importance in energy-sensitive applications with a high performance requirement (necessitating high clock speeds, e.g. around 1 GHz, in combination with so-called data-parallel processor solutions) and that are cost sensitive (area overhead is relevant). Also, application behavior determines data leakage in SRAM. The leakage is dependent on the 0-1 sequence of the data and especially on how long the data needs to remain available. E.g. some data need to be kept only very temporarily and the SRAM partitions that contain such data can then be powered down for part of the time to reduce the leakage.

Hence, there is a need for improving local (embedded) data and instruction memory structures with respect to energy leakage where at the same time also the dynamic energy consumption remains limited or is preferably even further reduced.

SUMMARY OF CERTAIN INVENTIVE ASPECTS

It is an object of embodiments of the present invention to provide a technique for reducing the total dynamic and leakage energy (standby and active leakage) problems in L1D and L1I/L0I memories, whereby the use of leakage-prone components such as the SRAM is no longer needed for dominated loop nests including all vector data accesses.

The above objective is accomplished by a method and device according to embodiments of the present invention.

In an aspect the invention relates in particular to a microcomputer architecture comprising a microprocessor unit and a first memory unit. The microprocessor unit comprises at least one functional unit and at least one register. The at least one register is a wide register comprising a plurality of second memory units, which are capable to each contain one word, the wide register being adapted so that the second memory units are simultaneously accessible by the first memory unit, and at least part of the second memory units are separately accessible by the at least one functional unit. The microcomputer is characterized by the first memory unit being an embedded non-volatile memory unit.

The first memory unit can be in certain embodiments a L1 data memory and in other embodiments an L1 instruction memory or an L1 configuration memory. Although the invention is described with respect to these various types of L1 memory, it is to be noted that a skilled person will appreciate that the same principles can readily be applied to L2 memory.

The leakage of the first memory unit (e.g. a L1D cache or any of the alternatives mentioned above) is reduced by using an embedded non-volatile memory (e.g. ReRAM or other type) as a scratch pad memory. Further, the register (very wide register) has asymmetric interface, i.e. the interface to the first memory unit is wider with respect to the interface to the functional units. Thus, multiple words can be simultaneously read from/written to the first memory unit and the registers, while each functional unit can read/write separately to the registers.

In a preferred embodiment the first memory unit is a L1 data memory, whereby the at least one wide register and the at least one functional unit are linked to a data bus internal to the microprocessor unit.

In another preferred embodiment the first memory unit is an L1 instruction memory. The microcomputer then preferably further comprises a loop buffer (L0 unit) between the L1 instruction memory and the at least one functional unit, said loop buffer being either a standard memory implementation or an embedded non-volatile memory unit. In the latter case, both the first memory unit and the loop buffer are then wide access non-volatile memories. The first memory unit has a larger line size (L1 line size) than the loop buffer (L0 line size).

In an advantageous embodiment the microcomputer with L1 instruction memory comprises a loop buffer being an embedded non-volatile memory unit and a multiplexing means arranged for deciding on which memory unit to access for transferring the instruction or configuration to the functional unit and whether to potentially bypass the loop buffer.

The microcomputer preferably comprises a single line register between the wide register and the loop buffer. This small line register is introduced to deal with the substantial energy consumption increase due to the addition of an extra port for reading from the wide register. This more energy efficient solution comes at the price of some additional hardware.

Advantageously, the microcomputer according to the invention comprises a further wide register adapted for exploiting access from the loop buffer towards the functional unit. This smaller wide register (e.g. a VWR) extracts a single instruction from the L0 line size and exploits the mostly regular access from the L0 loop buffer. This further reduces the energy consumption.

In another preferred embodiment the first memory unit is an L1 configuration memory.

Advantageously, the microcomputer then further comprises a loop buffer implemented as an embedded non-volatile memory unit. Both the first memory unit and the loop buffer are then wide access non-volatile memories. The first memory unit has a larger line size (L1 line size) than the loop buffer (L0 line size). The wide register then preferably comprises a multiplexer means arranged for deciding on which memory unit to access for transferring the instruction or configuration to the functional unit and whether to potentially bypass the loop buffer.

In a preferred embodiment the microcomputer comprises a bypass from the L1 configuration memory to the loop buffer. This bypass reduces the need for updating the wide register frequently and reduces the number of read accesses to the configuration memory. In another embodiment the microcomputer comprises a further wide register adapted for exploiting access from the loop buffer towards the functional unit. Due to the low energy read access of the wide register and the beneficial read access energy of the embedded wide word non-volatile memory (as compared to SRAM), this is a very attractive solution.

In preferred embodiments of the invention the first memory unit in the microcomputer has a divided bit line architecture with non-complementary bit lines. Such an architecture yields several advantages, like a more dominant periphery area due to the smaller cell area and a lower required voltage for the bit line precharging for a read operation.

Advantageously, the first memory unit comprises a sense amplifier connected to a first bit line and arranged for providing an amplified voltage swing from the first bit line to a second bit line, said second bit line connected to the plurality of second memory units. The presence of a sense amplifier contributes, in the event of a read operation, to achieving a low voltage swing.

In a preferred embodiment the first memory unit is a resistive RAM type memory or a spin transfer torque RAM type. Such materials display certain properties, such as low-power switching, potential for scaling, non-volatile nature, etc., and offer the possibility of very high density integration. In a more specific embodiment the first memory unit is resistive RAM type memory with one resistor and two transistors, so that a larger current is obtained during a set from a high memory cell resistivity state to low memory cell resistivity state, resulting in a faster read operation.

In certain embodiments the first memory unit is a hybrid memory structure, further comprising a SRAM memory for use in scalar operations and accesses.

In another aspect the invention relates to a compiler for converting application code into execution code adapted for execution on a microcomputer as previously described, said compiler comprising
- means for receiving application code, the application code including memory access operations,
- means for converting the application code such that the memory access operations are translated into irregular and regular memory operations
  (a) read operations comprising simultaneously reading of a plurality of words from the first memory unit and simultaneously writing the plurality of words into the register,
  (b) write operations comprising simultaneously reading a plurality of words from the register and simultaneously writing the plurality of words into the first memory unit, whereby a reorganized mapping of the array indices for the regular and irregular memory accesses towards read operations and write operations is performed, whereby the irregular indexing operations are dominating in the read operations and the regular indexing operations are dominating in the write operations.

Advantageously, the compiler further comprises means to perform a data flow transformation to move irregularly indexed write operations to a read operation.

In a further aspect the invention relates to a method for converting application code into execution code adapted for execution on a microcomputer as described above. The method comprises the steps of:
- obtaining application code, the application code comprising memory access operations, said memory access operations comprising read operations and write operations,
- converting at least a part of the application code, such that the memory access operations are translated into irregular and regular memory operations, whereby the read operations comprise simultaneously reading of a plurality of words from the first memory unit and simultaneously writing the plurality of words into the at least one register and the write operations comprise simultaneously reading a plurality of words from the at least one register and simultaneously writing the plurality of words into the first memory unit,
- reorganizing the mapping of the array indices for the regular and irregular memory accesses towards read operations and write operations whereby the irregular indexing operations are dominating in the read operations and the regular indexing operations are dominating in the write operations.

In a preferred embodiment the level of domination of the read and write operations, respectively, is determined by comparing the performance of microcomputer as previously described with the performance of a system wherein the non-volatile memory unit is replaced by SRAM memory.

Advantageously, the method further comprises a step of performing a data flow transformation to move irregularly indexed write operations to regular read operations.

When more than one read operation corresponds to a single write operation, the method preferably comprises a step of changing or transforming the sequences of read and write access operations for each pair of read/write operations.

In a further embodiment multiple write accesses that only partially use the width of said wide register, are merged.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures, and in which.

Figure 1:
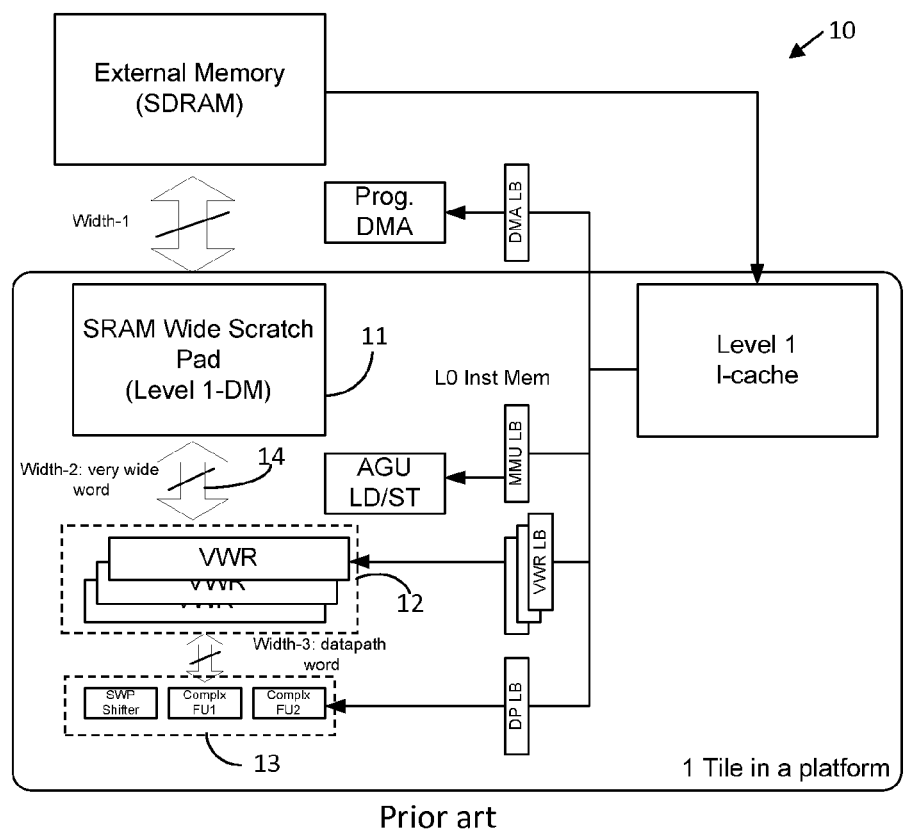
FIG. 1 illustrates a prior art microcomputer architecture with an SRAM-based wide scratch pad memory.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention. Any reference signs in the claims shall not be construed as limiting the scope. In the different drawings, the same reference signs refer to the same or analogous elements.

DETAILED DESCRIPTION

The present invention will be described with respect to particular embodiments and with reference to certain drawings but the invention is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising," used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

The low energy read access of the ReRAM and the read/write asymmetry due to the loop dominated nature of the codes makes the usage of ReRAM alternatives highly preferable for embedded systems running the wireless/multimedia target applications. Apart from the obvious advantages of lower leakage and area, the compatibility of ReRAM with logic technology also makes it suitable to replace SRAM at such low levels (L0). Thus the L1 and L0 loop buffer are substituted by ReRAM memories.

A set of typical system-level requirements for the ReRAM when used in an embedded wireless or multimedia application, include read access speeds below 1 ns, while write access speeds can tolerate a larger latency but not more than 2 cycles in L1 and 8 cycles in L2 normally. Energy per read/write access should be reduced as much as possible because of the portable context, preferably in the same range as the foreground memory access, so around 100 fJ/read word. Writing occurs less frequently so it can be more expensive. Area should remain low but due to the limited sizes (16-128 Kb for L1 and 128 Kb-8 Mb for L2) the cell area can be a bit relaxed compared to standalone contexts. Endurance should be high, preferably $10^{13}$ or higher for read access, but retention in the L1-L2 layers can be relaxed to a few days or even hours. The limited amount of data to be stored longer can easily be back upped in an off-chip NVM with long retention.

|  | 64 kb ReRAM 32 bit access (32 nm) | 64 kb ReRAM 512 bit access (32 nm) | 128 kb SRAM 32 bit access (90 nm) |
|---|---|---|---|
| {main/wordline} $V_{dd}$ (V) | (1.0/1.0) V | (1.0/1.0) V | (1.0/1.2) V |
| Read energy/access/bit | 23.01 fJ | 4.30 fJ | 146.3 fJ |

The read access energies for a 64 kb ReRAM design as proposed in embodiments of the invention are now compared with a 32 bit access 128 kb SRAM as illustrated in the paper "*A 3.6 pJ/Access 480 MHz, 128 kb On-Chip SRAM With 850 MHz Boost Mode in 90 nm CMOS With Tunable Sense Amplifiers*" (S. Cosemans et al., IEEE Journal of Solid-State Circuits, Vol. 44, 2009). The latter has been used as the base for building the ReRAM periphery so it is a fair comparison. The energy/access/bit is clearly the most efficient for the 512 bit access ReRAM at around 4.3 fJ, while it is around 230 for the 32 bit access ReRAM and around 146 fJ in the 32 bit access SRAM. Note though that the SRAM energy is considered at the 90 nm node so it has to be scaled back to 32 nm. An overly optimistic estimate would then assume a reduction squared to the technology scaling factor lambda but in these deep-submicron nodes it is more realistic to use a factor 3 to 5. That still puts the ReRAM in a very favorable position given the high leakage energy contribution typically related to the SRAM technology. Note also that a number of differences are present in the environmental variables like word line $V_{dd}$, timing pulse etc.

The dynamic read energy/bit is 4 fJ for a 32 nm technology node, with a typical L1D size of 32 kb. Also for larger L1D sizes the speed and energy efficiency are maintained. Above 1 Mb more cycles would be needed however for these memory sizes, L2 memory is considered where more latency is acceptable. The active leakage is heavily reduced compared to an SRAM because the ReRAM cell does not leak and the periphery is kept minimal compared to an SRAM. This is a very acceptable total energy, even if read operations are performed often. To compare regarding energy, a multiplication in the processor data path namely requires the same order of magnitude in 32 nm.

Also the read access times (see table) of the proposed ReRAM models are comparable to those of commercial/pre-production SRAMs. These results show the overall system requirements (mentioned above) are met so the wide word access ReRAM can potentially be used for embedded L1 (along with SRAM for the scalar access mode) using the data parallel foreground memory data registers, e.g. VWR, based processor architecture interface that has been proposed in "*Ultra-low power domain-specific instruction-set processors*" (chapter 8, F. Catthoor et al., ISBN 978-90-481-9527-5, Springer, June 2010).

|  | RAM | SRAM |
| --- | --- | --- |
| Read Time (ns) | <0.3 ns | <0.3 ns |
| Write/Erase Time (ns) | <0.3 ns | (10-5) ns |

In FIG. 1 a prior art data-parallel processor architecture 10 is presented with focus on the L1D wide scratch pad 11 (or cache) coupled to a (very) wide L0 foreground memory 12 with asymmetric interfaces (wide to the L1D 11 and medium/narrow to the processor data path 13). Typical bit width sizes for the L1D 11 and wide L0 interface 14 are 128 to 2048 bit, but these are not absolute bounds (they can change depending on further technology evolution e.g.). Also non power of 2 sizes have been used as instances such as for example 960 or 576 bit. A very energy-efficient solution for this wide L0 foreground memory 12 is the Very Wide Register (VWR) as described in patent document U.S. Pat. No. 7,694,084, which is hereby incorporated by reference in its entirety. This VWR features an asymmetric interface.

As opposed to the prior art situation illustrated in FIG. 1, the present invention discloses in certain embodiments a microprocessor architecture wherein SRAMs, more particularly SRAMs forming the level-1 cache, are replaced with an embedded non-volatile memory (ENVM) (e.g. Resistive RAM (ReRAM) or another type of non-volatile memory for which the read operation is fast enough (1-2 processor cycles, e.g. 1 ns) and which has an acceptable energy per access (acceptable means the dynamic energy being lower than that of SRAM) with a non-uniform access scheme. It is to be noted that conventional NVMs like stand-alone ReRAM or phase change memory (PCRAM) are not applicable in this context. An interesting alternative is e.g. STT-RAM (magnetic spin torque RAM). ReRAM materials display certain properties, such as low-power switching, potential for scaling, non-volatile nature, etc. These materials offer the possibility of very high density integration and are believed to be free from the inherent scaling problem of capacitance-based RAMs such as dynamic RAM (DRAM), floating body and ferroelectric RAM.

Figure 2:
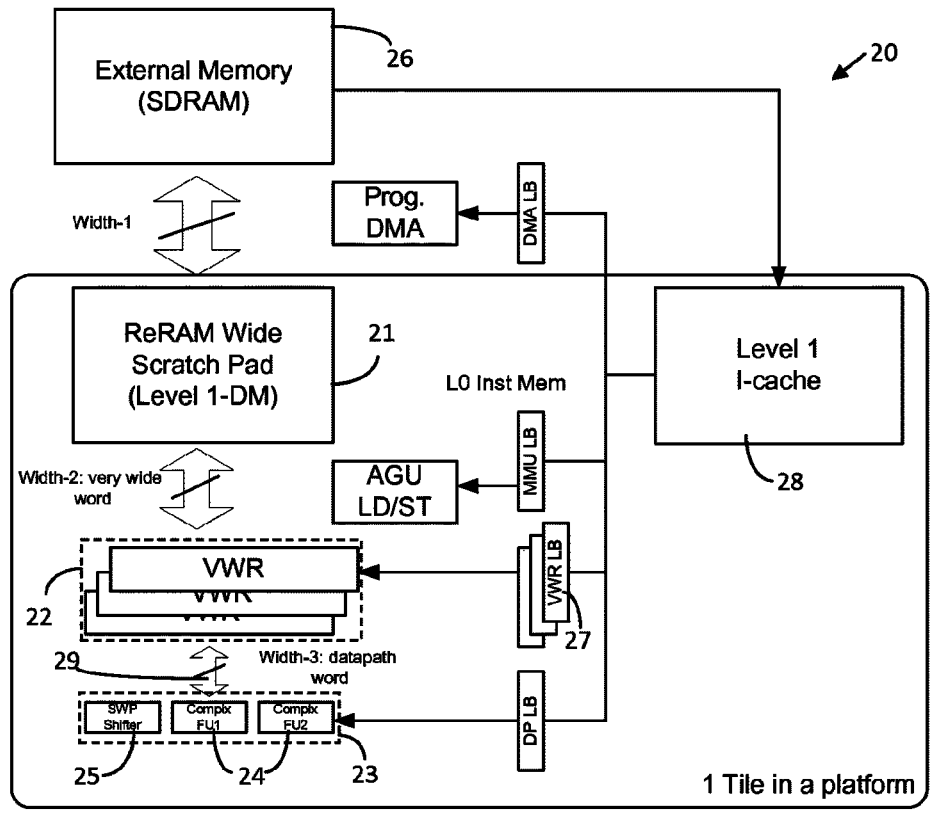
FIG. 2 illustrates a microcomputer architecture with a ReRAM-based wide scratch pad memory, according to embodiments of the present invention.

Replacing the SRAMs by ENVMs, in particular for example by ReRAMs, yields the advantage that leakage energy is severely reduced both in standby and active mode, but also the dynamic energy itself is further reduced because of the small cell size (which decreases the capacity) and the use of wide read access parts. In FIG. 2 one embodiment of a microprocessor architecture 20 according to embodiments of the present invention is illustrated, in which no SRAM wide scratch pad memory 11 is provided, but rather a ReRAM wide scratch pad memory 21. An advantage of embodiments of the present invention is the removal of the energy leakage problem in traditional SRAM solutions by substituting it with an ENVM memory, e.g. a ReRAM memory.

The microcomputer architecture 20 according to embodiments of the present invention further comprises a foreground memory 22 and a data path 23. The data path 23 comprises at least one functional unit 24 for performing operations on data fetched from the foreground memory 22 and optionally a shuffler 25 for rearranging data subwords applied to or emanating from the functional units 24. The foreground memory 22 provides the data access for the functional units 24 to accomplish the intended functions from a program being executed. The foreground memory 22 has asymmetric interfaces (wide to the L1D 21 and medium/narrow to the processor data path 23, hence wider to the scratch pad memory 21 than to the data path 23). The foreground memory 22 may for example comprise or consist of one or more very wide registers (VWR). The one or more data registers of the foreground memory 22 have a width larger than the word length used for the functional units 24 of the architecture, e.g. the one or more registers of the foreground memory 22 may be as wide as the line size of the external memory 26. The registers of the foreground memory 22 can all be single ported. The at least one data register of the foreground memory 22 thus is a very wide register comprising a plurality of second memory units which are each capable of containing one word. This means that the information potentially present in a data register of the foreground memory 22 comprises a plurality of words and is thus more than what a functional unit 24 of the architecture can handle. Therefore, selection means such as a multiplexer (not illustrated) are provided in order for the functional units 24 to select certain information from the data register of the foreground memory 22. The selection means may subsequently select different words from the data temporarily stored in the data register of the foreground memory 22, under control of a loop buffer 27. By doing so, less read action from the level-1 memory 21 are required, and as reading from memory turns out to be very power hungry, less reading actions result in lower power consumption. The use of the asymmetric interface of the foreground memory 22 is important to at least some embodiments of the present invention. The asymmetric use of the foreground memory is explained in the example below.

A simple example is provided to illustrate the principle of the asymmetric use of the foreground memory data register (e.g. VWR). Four words are assumed in each VWR/ReRAM line organized as follows: [1 2 3 4] [5 6 7 8] [ . . . ] and further a word read scheme is assumed in the processor with the following schedule: 1 3 4 2 8 5 6 7. Then the line-wide read operations are fully utilized and one can assume that the VWR-ReRAM read based transfer can be performed at ¼ of the processor frequency. This can be generalized for any number of words (N) per line of course. However, if one has e.g. the schedule 1 5 6 2 8 3 4 7, obviously mixes of line 1 and 2 are needed. So, unless there are multiple foreground memory data registers, e.g. VWR instances, in the processor, one has to load the lines multiple times. In this example it would actually be twice more, because both the first and second line data are required twice. Hence instead of ¼ it is now needed to read at half the processor frequency. A similar problem is encountered in the case of multiple accesses to the same word, e.g. in the schedule 1 3 4 2 8 5 6 4 7 8 9 1 wherein also 6 accesses are needed over 12 processor cycles.

In an aspect of the invention the read periphery and the cell dimensioning (of the memory cell in e.g. ReRAM) are optimized to work at speeds of 1 GHz and above with a very low read energy/access (below standard SRAM read energy/access). In particular $R_{low}$ values can be optimized, for example in a range between 10 kΩ and 400 kΩ, such as between 10 kΩ and 100 kΩ, e.g. 20 kΩ, and $R_{high}$ values, for example in a range between 700 kΩ and 100 MΩ, such as between 800 kΩ and 2 MΩ, e.g. 1 MΩ). Note that $R_{low}$ represents the resistivity value of the low resistivity state of the memory cell and $R_{high}$ the value of the high resistivity state.

Values of 20 kΩ and 1 MΩ are typical low resistive state (LRS) and high resistive state (HRS) resistance values, $R_{low}$ and $R_{high}$, obtained from cell measurements and calibrations. These resistance values are not fully fixed or the optimum. The resistance values for the LRS and HRS essentially depend upon the following:

The limitations of the cell itself: whether it can show such variations in resistance values of the two states, the lower limits and the upper limits of the resistance values etc.

The technological limitations: the drive current required for the read and write operation significantly increases when the resistance values of the cell are decreased. Since drive current is proportional to transistor widths, the lower the cell resistance, the larger the transistor and hence the area. The lower resistance values, of the LRS state in particular, help in faster discharge across the bit line and significant reduction in read delay. Hence area optimizations and trade-offs between delay and area need to be considered before coming to optimized resistance values for LRS and HRS respectively.

In an aspect of the invention the write scheme is less optimized for speed, but is mostly optimized for low write energy/access. It is assumed that 8 to 16 cycles (8-16 ns) is sufficient (related to speed), because of the architectural innovation explained further in this description.

A set of solutions is now provided for the use of embedded non-volatile memories as a replacement for SRAM forming the level-1 cache.

I. Circuitry Solution for Non-Volatile Memories (e.g. ReRAM)

In a particular embodiment of the present invention a ReRAM cell is used as a memory cell in the level-1 cache. The memory cell is not limited to ReRAM, but also other non-volatile memory types may be used for which the read operation is fast enough and which has an acceptable energy per access (see above for typical requirements). The memory cell comprises a memory element, e.g. an active resistive element in case of ReRAM, and a switch element for controlling the memory element. As a particular implementation, a 1R1T (1 resistor, 1 transistor) solution may be used. Here, the access transistor (tuned to drive required voltages) switches the resistive element.

A sense amplifier (SA) is a circuit that amplifies a small input signal to a full level output. Due to the large array of ReRAM cells, the resulting signal, in the event of a read operation, has a low voltage swing. The most important sense amplifiers are the read sense amplifiers, which amplify the small voltage swing on the data lines towards the memory output. The main goal of the read sense amplifiers is to speed up the read operation. For particular classes of read sense amplifiers the use of a very low swing signal on these data lines is enabled. A smaller required swing has two advantages: it reduces the energy consumed in the charging and discharging of large capacitors and it reduces the time the cell or read buffer needs to develop this swing.

In order to address the memory cells of the embedded non-volatile memory array, word lines and bit lines are provided. Bit line energy and delay is directly related to the bit line structure. Typically, a plurality of memory cells, e.g. 1024 cells, connect to a long bit line with a large capacitance. Before a read operation starts, the bit line may be pre-charged high.

In accordance with embodiments of the present invention, the bit line scheme can be optimized for data-parallel read access, so that the cell access (transistor sizing and $R_{low}/R_{high}$ choice) and the sense amplifier globally meet an access speed (even in worst-case conditions) of 1 or 2 processor cycles (e.g. 1 ns or below). In this optimization the ratio of the number of cells per local bit line to the number of local blocks is an optimization parameter due to the separation of local and global bit lines.

In an embodiment of the invention, the divided bit line architecture as defined in '*Low power SRAM Design using Hierarchical Divided Bit-Line Approach*' (Karandikar and K. K. Parhi, Int'l Conf. on Computer Design: VLSI in Computers and Processors (ICCD), pp. 82-88, 1998) is deployed in the ReRAM circuitry. In the divided bit line scheme, the bit line is divided into local bit lines connected to a global bit line via pass transistors. Hence, the effective bit line capacitance decreases depending on the number of local partitions. This in turn reduces the RC delay and also the energy consumption across the bit line. Both the local bit lines LBL and the global bit line GBL are precharged high initially and then the pass transistors are activated along with the word line activation. The bit line discharge across the local bit line translates to the discharge across the global bit line. The divided bit line architecture defines a bit line and a complementary bit line as set out in the Karandikar paper. In one embodiment divided bit line architecture is an essential feature for the circuit, as the architecture strongly enables achieving the required speed and energy specs.

Figure 3:
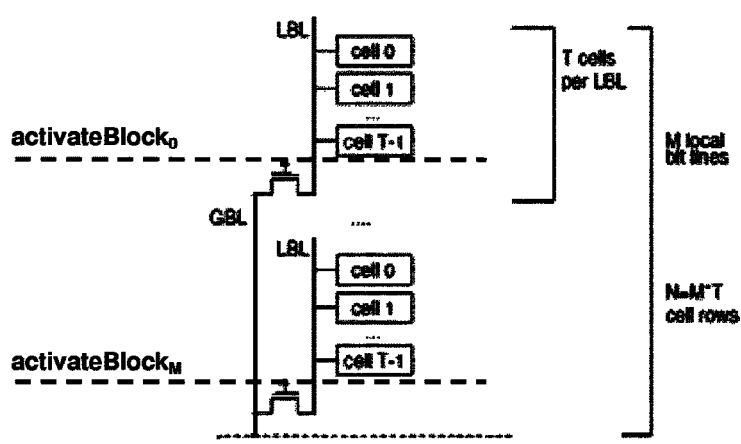
FIG. 3 illustrates a divided bit line architecture in accordance with embodiments of the present invention.

In accordance with embodiments of the present invention, the structure of the divided bit line architecture has been modified whereby the respective complementary bit line has been omitted. Only one bit line is available. An illustration of a divided bit line architecture with non-complementary hierarchical bit lines is shown in FIG. 3. The most important differences with the conventional SRAM approach are the following:

- Due to the smaller cell area, the periphery area is more dominant.
- Concerning the word line half-selected (WLHS) cells, the SRAM architecture always discharges the bit lines, which causes energy consumption. When a ReRAM architecture is adopted, there is no discharge. Hence, a wide multiplexer can be used, the sense amplifier can be shared among more cells and better sense amplification can be achieved.
- Bit line precharging for a read operation is performed at a lower voltage
- The read current is non-linear
- A single-ended bit line can be used (similar to a 8T SRAM cell)

In an embodiment of the present invention a sense amplifier as described in "*Variability-aware design of low power SRAM memories*" (S. Cosemans, PhD Thesis, modified version 2010-10-11, Chapters 4 and 5) may be deployed as sense amplifier in the ReRAM circuitry. The sense amplifier may be tuned (width of transistors, the length is kept constant) for use within the ReRAM context. Tuneable sense amplifier parameters include sense amplifier transistor widths and wire widths (global bit line, local bit line, global word line, local word line).

The invention also relates to a method for configuring the parameters of the ReRAM device periphery. The parameters include sense amplifier transistor widths, access and precharge transistor widths, decoder, selector and driver networks transistor widths and wire widths (global bit line, local bit line, global word line, local word line etc. . . . ). The parameters of the ReRAM device periphery are defined using an optimization technique. The electrical model of the ReRAM cell used consists of several different types of circuit components. The freely chosen parameters of these components have, dependent on the technology, different influences on the circuit characteristics (energy, delay, area).

Figure 4:
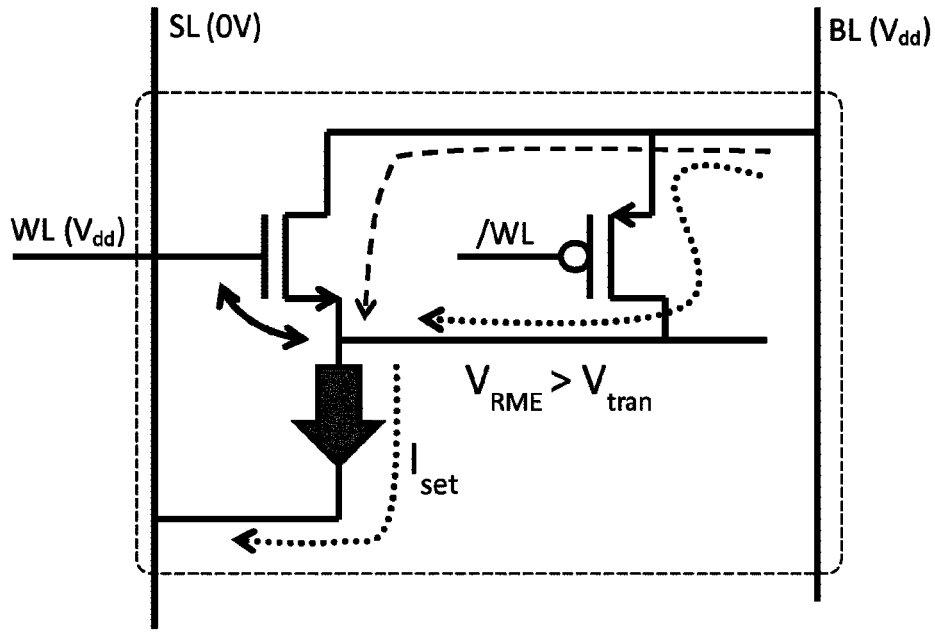
FIG. 4 illustrates the divided bit line architecture with a single bit line and additional PMOS transistor in parallel for write operations.

An important issue to deal with relates to the reduced voltage $V_{GS}$ during a set (from a High RS memory cell state to Low RS memory cell state). The transistor operates almost in sub-threshold. The maximum set current is below 10 µA. The $V_{GS}$ is sensitive to threshold variations. It is impossible to reach $V_{trigger,set}$. In order to solve this problem an additional PMOS transistor is added, so that a 2T1R cell is obtained. FIG. 4 provides an illustration. This indeed enables a larger current $I_{set}$, and allows a faster read operation. This benefit comes at the price of an area penalty. Note that one is still limited to $V_{DD}$.

An adapted gradient descent optimization technique has been employed to define ideal parameters for periphery in the circuit. But also other non-local optimization methods may be used that can handle non-linearity and discrete search spaces.

II. Semi-Random Write Access of the ReRAM

In order to use the ReRAM as a suitable replacement device for an SRAM, an overall write access of 8 to 16 ns should be attained. This can be achieved with proper dimensioning of $R_{low}$ and by trading off with retention. For a 32 Kb memory $R_{low}$ is expected to be about 20 kΩ (see explanation above). This means that for a 1V supply 50 µA is needed which means 250 fJ/bit (1V*50 µA=50 µW; 5 ns*50 µW=250 fJ/bit) if one can limit the actual resistive loading to 5 ns. That is a very acceptable energy, especially because the amount of line writes can be limited significantly with the architecture (see the example illustrating the asymmetric use of the foreground memory data register above). With a higher $R_{low}$, i.e. a resistivity value of the low resistivity state of the ReRAM cells higher than 20 kΩ, potentially the energy can be reduced further, but then one is faced with strong trade-offs with the read speed, which is quite critical.

From the architecture and mapping point of view, the 8 to 16 ns cycle write access is tolerated if a very regular write scheme (see the example illustrating the asymmetric use of the foreground memory data register given above) is imposed where the foreground memory solution, e.g. VWR, is (nearly) fully exploitable (e.g. VWR bandwidth is not yet fully exploited if 6 data-paths with a width of 128 bit are using a 1024 bit wide memory port). In practice that means the usage of e.g. a 128 bit data path width (width-3 in FIG. 2) and a 1024 bit wide ReRAM/foreground memory port (width-2 in FIG. 2), or thus a wider ReRAM/foreground memory port width (width-2) than the data path width (width-3). The width-3, e.g. 128 bit, data path word enables a large amount of data-parallel subwords of, for example, 8, 16 or 32 bits (or even more flexibility with a soft-SIMD solution). In the example given, there is a ratio of 8 between the width of the ReRAM/foreground memory port and the data path width, so a ReRAM-VWR write is required every 8 processor cycles. For a ratio of 16 between both the data parallelism has to be reduced (e.g. 64 bit data path) and, hence, also the overall platform performance and energy efficiency. This leads to less desirable trade-off points, but is still feasible in many markets.

The mapping of the read/write indexing scheme in the processor architecture has to be adapted in accordance with embodiments of the present invention, to a very asymmetric one where all the irregularity in the algorithm R/W behavior is pushed on the read side and the write size is kept fully regular (see the example illustrating the asymmetric use of the foreground memory data register above). That is achievable in any practical signal processing algorithm that would profit from mapping on a data-parallel processor. The mapping can be adapted in the program code executed on the architecture or in the hardware periphery of the embedded non-volatile memory. This is further elaborated below taking the example of program code adaptation.

In an aspect of the present invention a method is provided for converting, during a compile time phase, application code into execution code suitable for execution on an architecture 20 according to embodiments of the present invention.

Such architecture 20 at least comprises a microprocessor unit and a first memory unit 21. The microprocessor unit comprises at least one functional unit 24 and at least one data register 22, the at least one functional unit 24 and the at least one data register 22 being linked to a data bus which is internal to the microprocessor unit. The data register 22 is a wide register comprising a plurality of second memory units which are capable to each contain one word. The wide register is adapted so that the second memory units are simultaneously accessible by the first memory unit and so that at least part of the second memory units are separately accessible by the functional unit 24. The method according to an embodiment of the aspect of the present invention comprises:

obtaining application code, the application code including memory access operations comprising read operations and write operations, converting the application code such that the memory access operations are translated into irregular and regular memory operations; the read operations comprising simultaneously reading of a plurality of words from the first memory unit 21 and simultaneously writing the plurality of words into the data register of the foreground memory 22, and the write operations comprising simultaneously reading a plurality of words from the data register of the foreground memory 22 and simultaneously writing the plurality of words into the first memory unit 21, mapping the regular and irregular memory operations towards read operations and write operations whereby the irregular operations are dominated by read operations and the regular operations are dominated by write operations.

The level of domination of the read and write operations is determined by comparing the system performance with the performance of an SRAM based system (taking into account the speed requirement of the application). The system performance has to be (significantly) similar or better than an SRAM based system. The level of domination of read and write operations is dependent on this (e.g. if the performance of the system is not comparable to an SRAM based design, the level of domination of read and write operations should be changed).

Regular memory operations involve only data access situated in nested loops without pre-amble and post-amble (only data access in inner loop). The regular memory operations are not dependent on the data values themselves.

Additionally, a further transformation operation can be performed to move irregular write operations to a read operation (see the example to illustrate the asymmetric use of the foreground memory data register given above). A few additional examples are given to illustrate the principles of this conversion. First one write/read pair is assumed with a same length, i.e. a same number of accesses. The write operation is assumed irregular: 2 1 5 3 7 8 4 6 and the corresponding read is fully regular, e.g. 1 2 3 4 5 6 7 8. Then the write access order can be changed to the fully regular sequence 1 2 3 4 5 6 7 8 while converting the read sequence to 2 1 5 3 7 8 4 6. In a less trivial case a read sequence is considered that is mostly regular and has a longer length, e.g. 1 2 3 4 1 2 5 6 7 8. In that case the write sequence is again converted to 1 2 3 4 5 6 7 8 and the new read sequence becomes 2 1 5 3 2 1 7 8 4 6. In the most general case there is more than one read operation corresponding to a single write operation and in that case the above principle is applied to each write/read pair separately, which in practice is always possible.

The conversion of application code in this way is done to transfer the irregularity of the algorithm mostly to the read operation side to keep the write operations mostly or even fully regular.

Given the high speed and energy efficiency of a read operation (1 cycle at 4 fJ if needed) the potentially highly irregular read operations do not pose a problem.

In an aspect of the invention the foreground memory solution, e.g. VWR described in U.S. Pat. No. 7,694,084, is deployed in the ReRAM circuitry. As all the irregularity of the algorithm R/W behavior is pushed on the read side and the write side is kept fully regular as described above, the asymmetric interface of the foreground memory solution, e.g. VWR, is exploited to accommodate the irregular read operations. In the specific case of ReRAM, this is particularly interesting for the read access as explained above.

If there are multiple write operations which are only partially using the width of the wide memory, another conversion can be performed, wherein the partial write operations are merged, potentially at the cost of more read operations. Due to the very low read energy per access (see table) and the relatively large write energy/access this conversion is nearly always beneficial. For example, in case eight words can be written together in a 512 bit access, one can merge the write sequence 1 2 3 4 X X X X with the sequence 5 6 7 8 X X X X by moving the 5 6 7 8 words to another position in the overall data layout, ending up with the final layout 1 2 3 4 5 6 7 8. This can be generalized in a straightforward way to other partial write operations.

Semi-Random Read Cycle

The cell and periphery combination (taking into account the optimization parameters for the memory array) allows "semi-random" read access (potentially different line read every processor cycle) for the ReRAM-VWR communication. In practice an excessive number of foreground memory data register (e.g. VWR) loads is avoided by optimizing the data locality in the mapping, but in some cases this very fast access is unavoidable to meet the real-time requirements.

The ReRAM periphery allows achieving maximal frequencies that even go above 1 GHz if necessary. So, even very irregular schedules with a 1:1 ratio (lines to be loaded every processor cycle) can be accommodated. Note that in practice such worst-case situations will not happen often because the schedules in practice will be partly regular, but with a conventional arch/mapping combination this cannot be avoided. So the architecture has to be designed upfront to deal with such a worst-case. Due to the difficulty of the write access (see below) one explicitly opts for supporting the worst-case at the read access side of the ReRAM. The worst case is supported by achieving the speed requirements (e.g. 1 or 2 processor cycles).

III. Solution for Scalar Operations

Besides data-parallel operations, any application may also have scalar operations. Regarding scalar operations, the solution concerning asymmetric use of the foreground memory data registers, e.g. VWR, cannot be applied because the regular data access for the write mode cannot be ensured here as these operations do not belong to only regularly nested inner loops (see definition above).

In an embodiment of the invention a hybrid memory architecture is proposed. One part of the memory is SRAM, the other part is a non-volatile memory part. For the scalar access purpose, the conventional SRAM is used. The SRAM is not so critical for energy because the total access count is very low for this irregular scalar part, hence leakage will be minimal. The substrate (e.g. silicon) area for this SRAM is minimal because of the low total amount of scalars in any realistic target application. Therefore only a small SRAM is needed. The use of a small SRAM for scalar operations also removes any delay bottleneck.

Even for very scaled technologies (below 32 nm technology) one can live with cells and periphery that are not pushed at all toward small devices, given the non-critical delay, area and energy properties. Hence, leakage and reliability issues can be prevented by circuit overdimensioning.

IV. Use of Loop Buffers in the Instruction or Configuration Memory Organization, Exploiting the ReRAM Design The above solution can also be reused for the L1I instruction memory layer 28 (FIG. 2). For the instruction memory layer a similar problem exists as for L1D 21, though less severe (because there are no write operations from the processor—code is written once and the code is being read by the processor).

Figure 5:
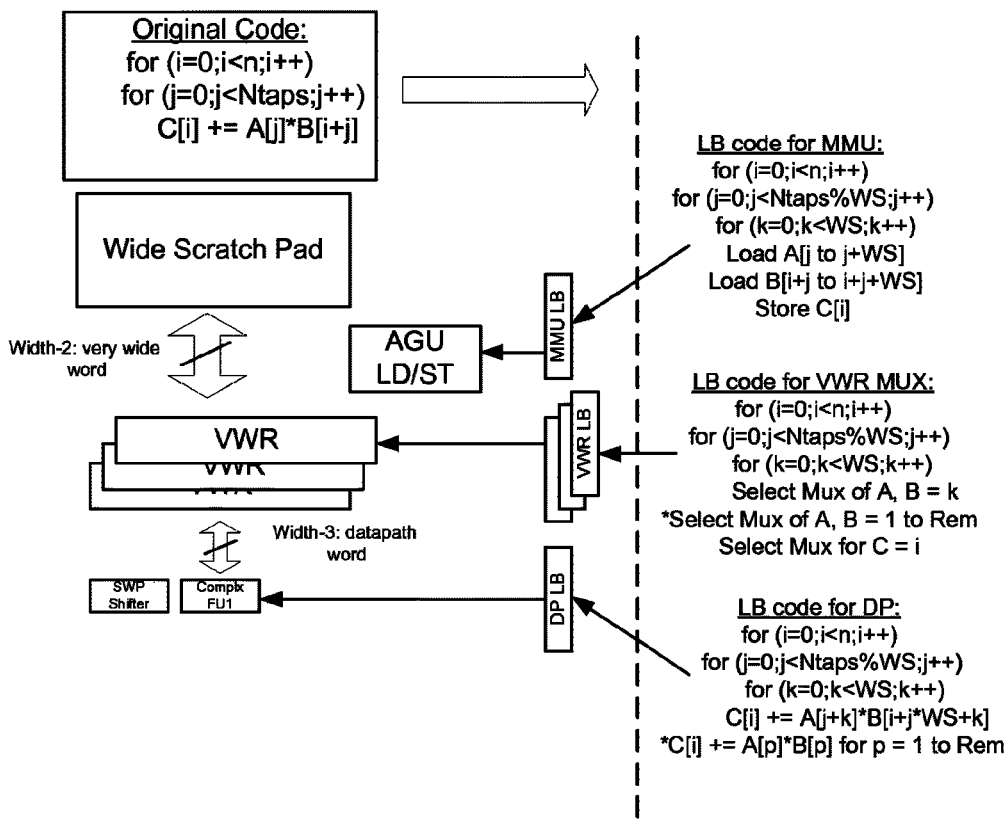
FIG. 5 illustrates the use of loop buffers for instruction memory, in accordance with embodiments of the present invention.

In accordance with an embodiment of the present invention, a distributed Loop Buffer (LB) organization as disclosed in U.S. Patent Publication No. 2008/0294882 may be deployed in the ReRAM architecture. In this case the wide word access from the L1I 28 to the LB layer is fully enabled and the dynamic energy bottleneck is gone from the L1I 28 itself. The leakage energy overhead in the cell array is removed by substituting the conventional SRAM for the level-1 instruction cache again with a non-volatile memory (e.g. ReRAM) solution. In the L1I periphery the leakage reduction can be ensured by adding non-minimal device sizes (leakage depends on W/L ratio of the device—smaller devices tend to leak more than larger device) which are affordable due to the small circuit overhead there and due to the very non-critical write requirements for the L1I layer (once the access of the proposed RRAM implementation is fully compatible). An illustration of the use of a loop buffer for instruction memory is provided in FIG. 5.

Embedded Instruction Memory Organization for a VLIW Processor (Single Core or Multicore)

In a conventional instruction memory organization a Base SRAM Instruction Memory Organization (BS-IMO) is applied. Both the L1 memory and the L0 loop buffer are SRAM based. In the proposed solution the loop buffer is a small instruction buffer designed to hold frequently executed program loops. Typically, in the first pass of a loop instructions from the higher levels are fetched and copied to the loop buffer. The instructions are then used in subsequent passes. When executing from the loop buffer, the L1 memory can remain idle, which has a positive impact on the system power consumption. The loop buffer can be implemented as a clustered loop buffer organization optimized for low energy Very Large Instruction Word (VLIW) Embedded Processors or, as previously mentioned, as a distributed loop buffer optimized for multi-threading. Alternatively, the loop buffer can be a simple variant of a zero overhead loop buffer. The loop dominated nature of the codes for the envisaged application and the resulting read-write asymmetry leads to significantly more usage of the loop buffer. This is certainly advantageous from both the energy and performance point of view, since the loop buffer is a much smaller memory (lower energy consumption) and closer to the data path than the L1 memory.

A further system level exploration is now presented of embedded NVM (for instance Resistive RAM) based hybrid Instruction Memory Organization.

While the read-write asymmetry does alleviate the problems associated with the ReRAM write access to some extent, it would still not be a feasible alternative. The write energy consumption becomes manageable as a result of smaller number of write accesses compared to read accesses (read/write asymmetry) and acceptable ReRAM cell write energies compared to SRAM cell write energies. However, the penalty due to the ReRAM write latency still results in performance penalties. A ReRAM write latency of 8 to 16 cycles is assumed compared to the ReRAM read latency of 1 cycle. One possible way to limit the write access problems is by the use of wide word access schemes. Utilizing wide word access schemes for memories has a number of advantages:

- Writing the wide word into the L0 loop buffer reduces the average write energy consumption per bit
- Wide word write also reduces the effective total time required to write the frequently executed loops into the loop buffer
- Since, the number of write cycles required to transfer the data to be executed are limited, ReRAM based memories are more resilient to lifetime degradation
- The wide word read access for ReRAM is much more efficient per bit as compared to that of SRAM because the cumulative capacitive load of the SRAM cells is not present.

Hence, a wide word access scheme for the L0 loop buffer is applied.

Figure 6:
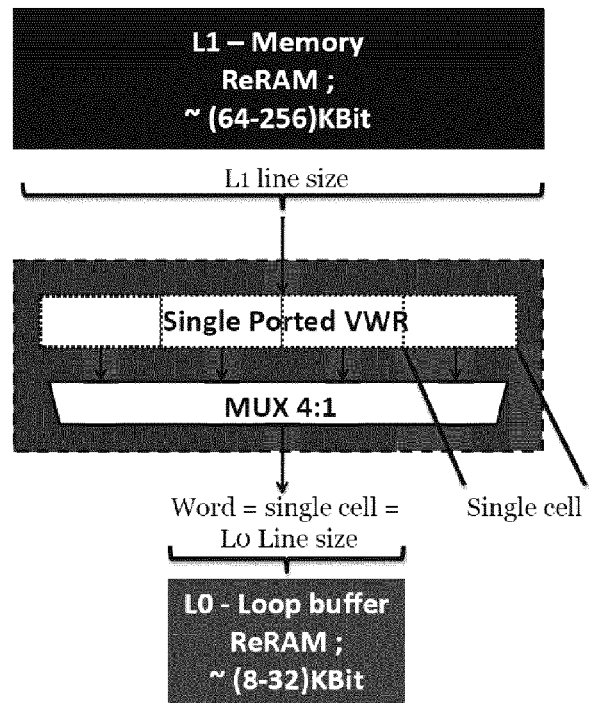
FIG. 6 illustrates a very wide register organization with asymmetric interfaces.

Reading data from the L1 memory in case of non-loop code is still highly energy consuming simply due to the size of the memory. Hence, a Very Wide Register (VWR) is used for low energy access of non-loop code and also to facilitate the data transfer from the L1 memory to the L0 loop buffer. A VWR is a register file architecture, which has single ported cells and asymmetric interfaces (see FIG. 6).

Figure 7:
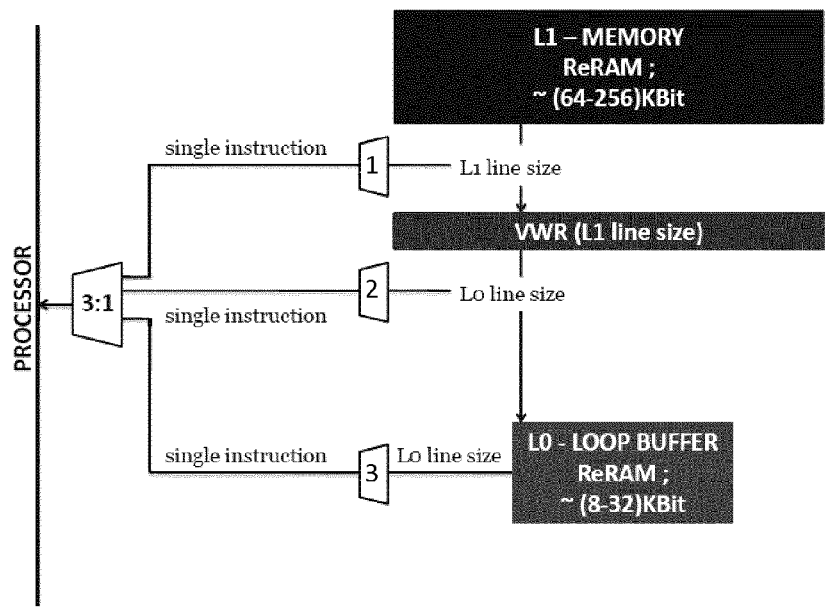
FIG. 7 illustrates a modified hybrid instruction memory architecture.

The interface of the VWR, in this case, is wide towards the L1 memory and narrower towards the loop buffer, as discussed previously. The VWR is always kept as wide as the line size of the background memory (L1 in the current organization) and complete lines are read into it. The VWR has its own multiplexer (MUX), and the controls of the MUX that decide the cell to be accessed can be derived from the program counter itself. The modified instruction memory architecture, Modified ReRAM Instruction Memory Organization (MR-IMO), is shown in FIG. 7. Both the L1 memory and the L0 loop buffer are ReRAM based wide word access memories (32 instruction word access for L1 memory and 8 instruction word access for L0 loop buffer). In the proposed architecture each VWR cell size has a capacity of 8 instructions, which is the word-size/output of the VWR and equal to the line size of the L0 loop buffer. The VWR has a single cycle access similar to register files. Per write cycle (L0 line size) 8 instructions are written into loop buffer to minimize the write energy consumption and the performance penalty due to ReRAM write latency.

Figure 8:
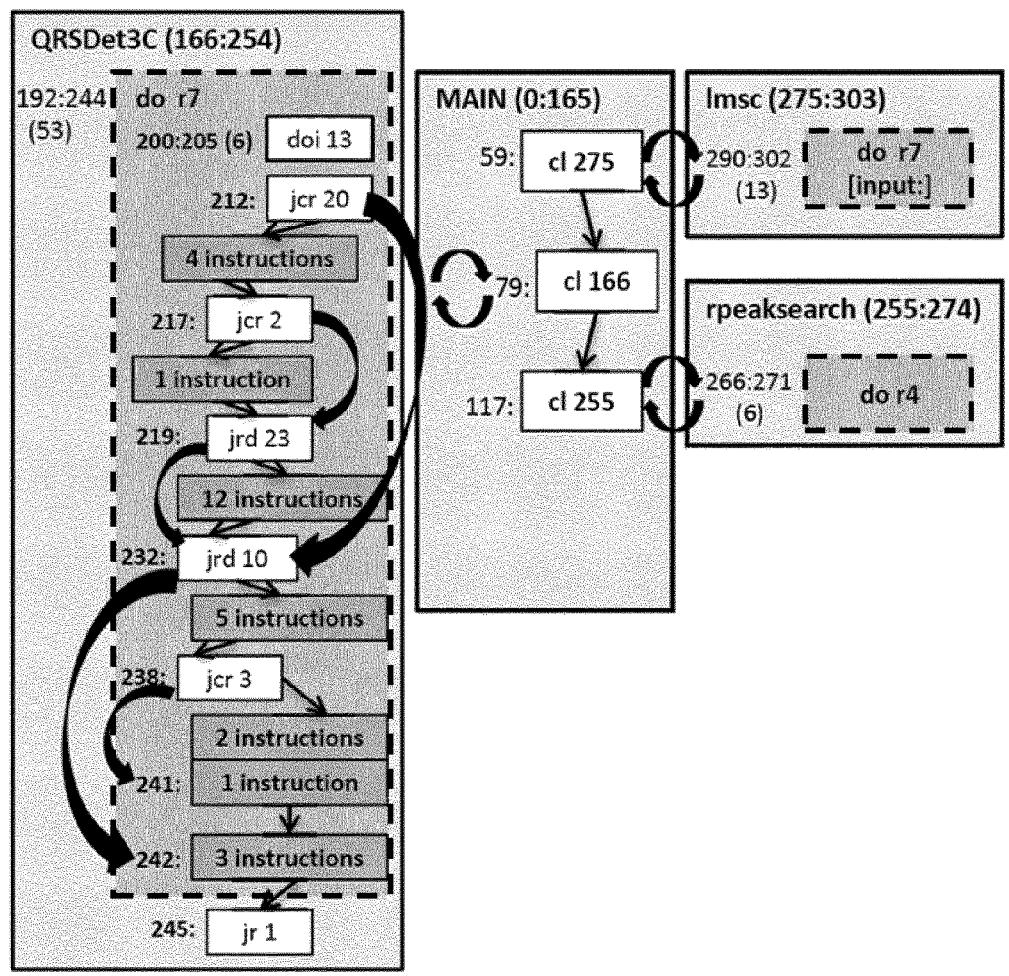
FIG. 8 illustrates a breakdown of an optimized instruction flow.

The example given in FIG. 8 will help illustrating the data flow in a better manner. The figure is simply a breakdown of the CWT-optimized instruction flow. The four main functions (MAIN, QRSDet3C, lmsc and rpeaksearch) that make up the instruction code are shown along with the instruction code sequences they correspond to. The loop bodies are represented by the dashed boxes. The loop body size is indicated beside it (towards the left side) by means of loop 'start' and loop 'end' instructions (e.g. 192:244). The loops are initiated either by the 'do' or the 'doi' instructions. The instruction flow and jumps are specified by means of arrows.

The L1 line that contains the instruction to be accessed is always transferred to the VWR in case of non-loop codes in the first pass. Subsequent accesses are from the VWR till the program counter encounters an instruction not present in the VWR. The corresponding L1 line is then transferred to the VWR and the cycle continues. The VWR is completely filled in each of its write cycle. Multiplexer network 1 extracts a single instruction from wide word written into the VWR towards the processor.

Once the 'loop flags' (a two bit register that indicates whether the loop has been activated and also the depth of the loops) are activated, the entire contents of the VWR cell (L0 line size) that contains a loop instruction in question is copied into the loop buffer. The write cycle into the ReRAM loop buffer takes place over 8 cycles as mentioned before. Due to the presence of a smart multiplexer network that selects a single instruction from the 8 instructions being written into the loop buffer, the data can be read from the VWR while it is being written into the loop buffer. However, the processor has to be stalled when the next instruction to be executed from the code is not present in the VWR cell segment from which the 8 instructions are being transferred into the ReRAM loop buffer, which leads to a performance penalty. Multiplexer network 2 extracts a single instruction from wide word written into the loop buffer from the VWR towards the processor. Multiplexer network 3 extracts a single instruction from wide word read from the loop buffer towards the processor. As can be seen from FIG. 8, there are function calls present within the loop body that call instructions lying outside the loop body. Although, technically, the loop flags are still active and it is a part of a particular loop execution sequence, these instructions lying outside the loop body are not copied into the loop buffer. Due to the ReRAM write latency, instruction codes having short loop bodies and those that are accessed less frequently can result in very performance penalties. This can be compensated for in a number of ways. One of the more simple ways to achieve this would be by reading the data from the L1 memory when the data is not present in the VWR cell segment being written into the loop buffer. Since always a wide word is read, this approach can lead to a significant increase in energy consumption.

Figure 9:
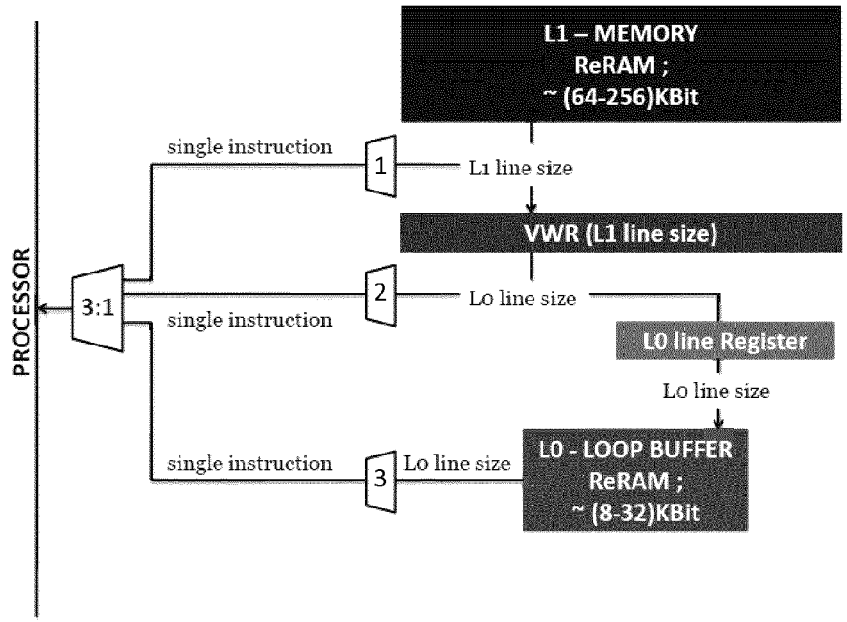
FIG. 9 illustrates a modified instruction memory organization with L0 line register.

Another possible option that can be explored is reading of data from the VWR itself during penalty cycles of the loop buffer write. Since adding an extra read port on the VWR will significantly increase the energy consumption, a small single line register (L0 line register) is introduced inbetween the VWR and the loop buffer, Performance Optimized ReRAM Instruction Memory Organization (POR-IMO), FIG. 9. This is a more energy efficient mode as compared to the previous option, but it also comes at the cost of extra hardware.

Figure 10:
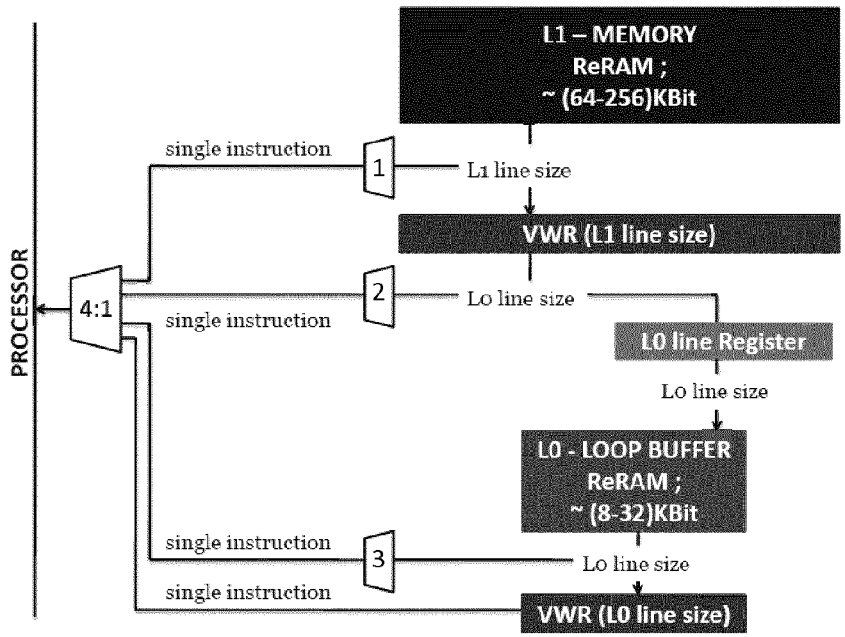
FIG. 10 illustrates an energy and performance optimized instruction memory organization.

The performance penalty can also be minimized without making any architectural changes if it is selectively omitted writing loops based on the loop body size and frequency of access (loop iterations) into the loop buffer. However, this may adversely affect the energy consumption depending upon the instruction code. Highly irregular codes will most likely show a bigger increase in energy consumption if the performance penalty is reduced in the said manner. The wide word being read from the L0 loop buffer every time it is accessed consumes more energy than the regular (smaller selective word) access scenario. This is a target for further energy optimization. A smaller VWR (that extracts a single instruction from the L0 line size) is used to exploit the mostly-regular access from the L0 loop buffer and reduce energy consumption even more. FIG. 10 illustrates this modification to the POR-IMO, energy and performance optimized ReRAM Instruction Memory Organization (EPOR-IMO).

For the ReRAM a 1(T)ransistor-1(R)esistor model cell stack may be used. The Low Resistive State (LRS) and High Resistive State (HRS) resistance values of the ReRAM cell obtained from cell measurements and calibrations were 20 kΩ and 1 MΩ respectively. These resistance values are not in any way fixed and are decided depending upon a number of factors like; the limitations of the cell itself (whether it can show such variations in the resistance values of the two states, and the lower limits and upper limits of the resistance values) and the technological limitations (the drive current required for the read and write operation significantly increases when the resistance values of the cell is decreased. Since drive current is proportional to transistor widths, the lower the cell resistance, the larger the transistor and hence the area. The lower resistance values of the LRS state help in faster discharge across the bit line).

Figure 11:
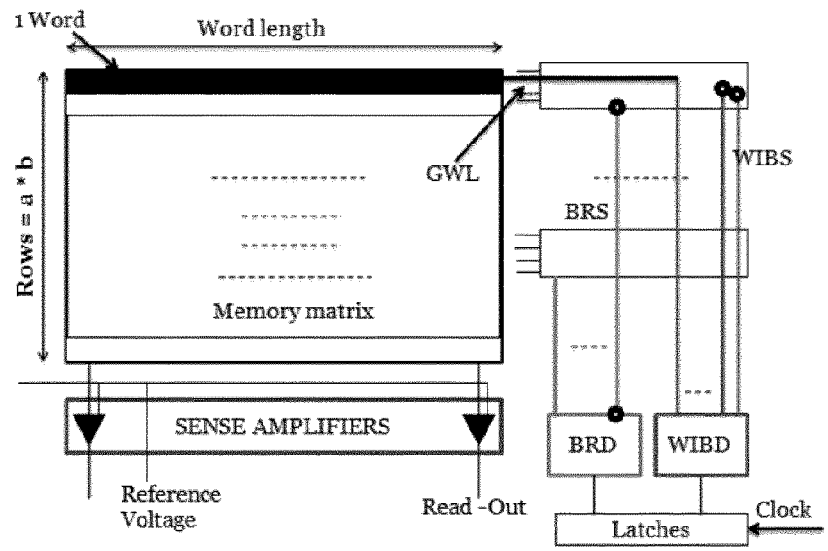
FIG. 11 represents a wide word access ReRAM structure.

The wide word access ReRAM array structure is given in FIG. 11. In the ReRAM design used for both the L1-memory and L0 loop buffer, the output is read as a single wide word across the entire length of the word line. Two first-level decoders are used to decode z address bits into two sets of one-hot output wires. The Block Row Decoder (BRD) decodes x address bits into a Block Row Select signals (BRS) signals, and the Within Block Decoder (WIBD) decodes the remaining y address bits into b Within Block Signals (WIBS), whereby $$x+y=z$$

and $$a*b=2^x=\text{rows}$$

These within block signals combine with BRSi to generate the word line.

Embedded Configuration Memory Organization for a Coarse Grain Array Processor (Single Core or Multicore)

Figure 12:
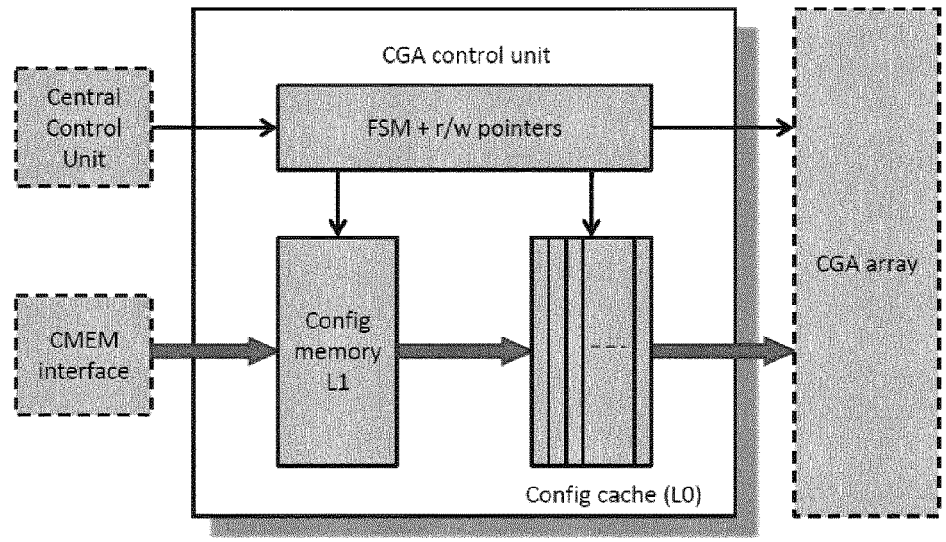
FIG. 12 represents a conventional configuration memory organization.

Similar to the Instruction Memory Organization (IMO) in many of the commercially available embedded systems today, a typical CGA control Unit as shown in FIG. 12 contains two levels: the configuration memory (L1) and the configuration cache (L0). The execution of the CGA is controlled by this control unit and a configurable processor core contains as many CGA control units as there are CGA partitions. The configuration memory is an ultra-wide memory and larger than the configuration cache (about 8 to 16 times), which is closer to the data-path. The cache implementation is meant to reduce the energy consumption of the control unit. This configuration memory cache effectively works as a traditional loop buffer, which is used to hold frequently executed program loops. This is fairly common in processors meant for loop-dominated applications (more hardware controlled flavors of the loop buffer are the loop cache or the filter cache). Typically, in the first pass of a loop, configuration words from the higher levels are fetched and copied to the configuration cache, and these configuration words are then used in subsequent passes. When executing from the configuration cache, the configuration memory can remain idle, which has a positive impact on the system power consumption. The configuration memory is SRAM based, whereas the configuration cache is an array of n D-latch registers and 2 flip-flop registers, where n denotes CGA cache depth.

As already mentioned, the integration of ReRAM based memories into the traditional memory hierarchy poses new architectural challenges. Despite the high-speed random access during reads, the write access of ReRAM technology faces a number of problems namely long latency, high energy and limited endurance, that fail to make simple ReRAM based memory architectures feasible. In the context of CGRAs, high write latencies require careful inspection of the different trade-offs. For example, due to the data parallel nature, loop counts may become smaller thus aggravating the latency problem if ReRAM modules are positioned in the wrong place.

FIG. 12 shows a conventional SRAM based architecture. The loop dominated nature of the codes for the target applications leads to more read accesses as compared to write accesses. This read-write asymmetry leads to significantly more configuration cache usage. This is certainly advantageous considering energy consumption (and also from a performance point of view, since the cache here is much closer to the data-path than the configuration memory). The low energy read access of the ReRAM and the application-wise read-write asymmetry makes the usage of ReRAM alternatives highly preferable for embedded systems running the target applications. Other than the obvious advantages of lower leakage and area, the compatibility of ReRAM with logic technology also makes it suitable to replace SRAM at such low levels. Below several embodiments of a configuration memory organization are presented wherein the SRAM based memory system is substituted by a ReRAM based counterpart. Given the high sensitivity of the configuration cache (loop buffer) to the increased write latencies, the L0 layer is carefully explored in order to attain energy savings without performance loss. A ReRAM based loop buffer with specific architectural extensions is considered as a replacement to the baseline configuration cache.

Given the high write/read latency ratio (write latency is 8 times higher than read), it can no longer be assumed that the configuration words are copied from the L1 layer to the loop buffer during the first pass of a loop without performance penalty. Thus, configuration words would need to be repeatedly read from the L1 configuration memory while writing into the loop buffer. This still is highly energy consuming due to the memory size.

Figure 13:
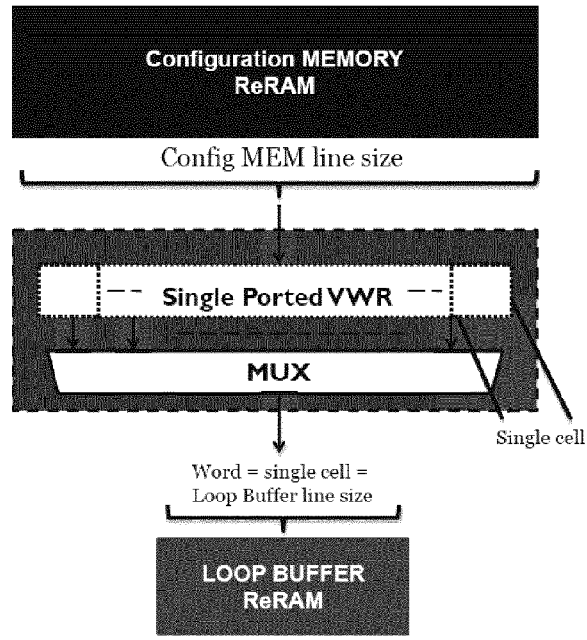
FIG. 13 represents a very wide memory organization with asymmetric interfaces.

Hence, a Very Wide Register (VWR) is introduced for low energy access and also to facilitate the data transfer from the configuration memory to the L0 loop buffer. A VWR is a register file architecture, which has single ported cells and asymmetric interfaces (FIG. 13). The interface of the VWR, in this case, is wide towards the configuration memory and narrower towards the loop buffer. This asymmetric register file organization, together with its interface to the wide memory, achieves a significantly higher energy efficiency than conventional organizations. The VWR is always kept as wide as the line size of the background memory (configuration memory in the current organization), and complete lines are read into it. The VWR has its own multiplexer (MUX) and the controls of the MUX that decide the cell to be accessed can be derived from the program counter itself.

Figure 14:
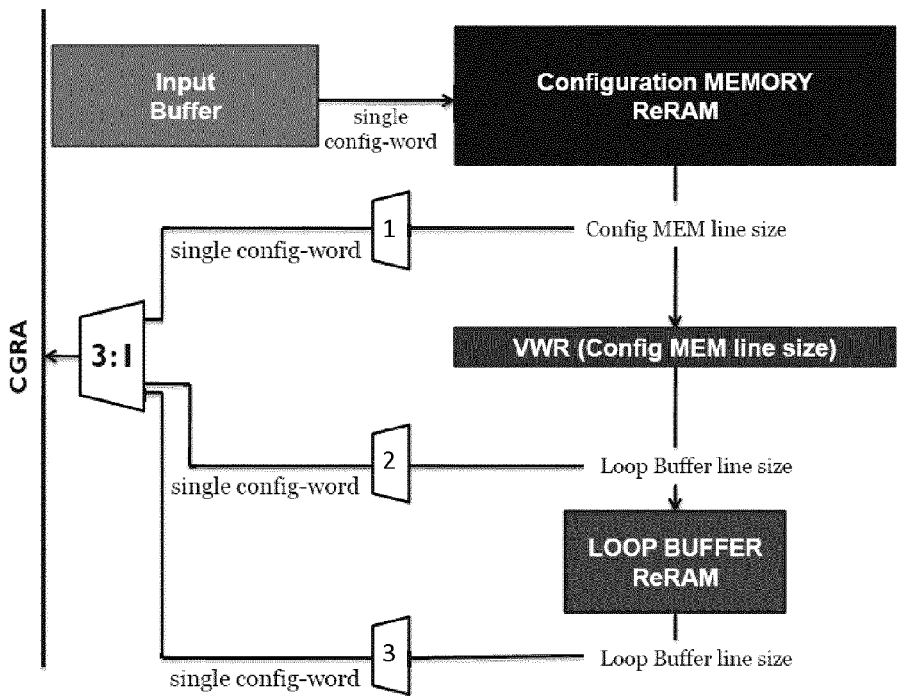
FIG. 14 represents an embodiment of a ReRAM based configuration memory organization.

An embodiment of a configuration memory organization according to this invention is shown in FIG. 14. Both the configuration memory and the loop buffer are ReRAM based wide word access memories: 8 parallel configuration word access for L1 memory and 4 configuration word access for L0 loop buffer. In the proposed architecture, each VWR cell size has a capacity of 4 configuration words, which is the word-size/output of the VWR and equal to the line size of the L0 loop buffer. The VWR has a single cycle access similar to register files. We write 4 configuration words per write cycle (L0 line size) into loop buffer to minimize the write energy consumption and the performance penalty due to ReRAM write latency.

The configuration line that contains the configuration words to be accessed is always transferred to the VWR in the first pass. In subsequent accesses, data is fetched from the VWR till the loop buffer write cycle is completed. The data is then fetched from the loop buffer until the next loop is encountered. The VWR is completely filled in each of its write cycle. Multiplexer network 1 extracts a single configuration word from wide word written into the VWR towards the processor. Once the loop flags are activated, the entire contents of the VWR cell (L0 line size) containing the 4 loop configuration words in question is copied into the loop buffer.

The write cycle into the ReRAM loop buffer takes place over 8 cycles as mentioned before. Due to the presence of a smart multiplexer network that selects a single configuration word from the 4 configuration words being written into the loop buffer, the data can be read from the VWR while it is being written into the loop-buffer. Multiplexer network 2 extracts a single configuration word from wide word written into the loop buffer from the VWR towards the processor. Multiplexer network 3 extracts a single configuration word from wide word read from the loop buffer towards the processor.

In one embodiment a memory organization with reduced word access size is implemented, wherein the configuration memory line is 4 configuration words wide and the loop buffer 2 configuration words wide. Note that the memories in this configuration are still considerably wide. So, this narrower interface makes every single access less energy consuming even though the energy per bit increases. If the extra-wide interface is efficiently exploited (i.e. if the number of accesses to the large configuration memory can be reduced by means of the VWR), it is still advisable to opt for wider interfaces as much as possible.

Figure 15:
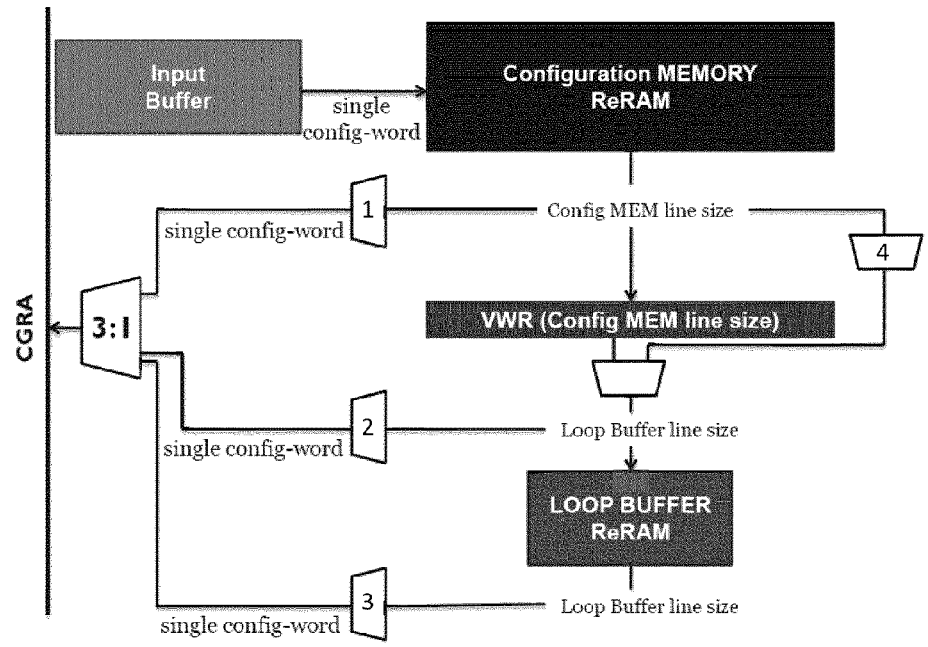
FIG. 15 represents an embodiment of a configuration memory organization with a bypass to loop buffer.

Addressing leads to a single cycle delay while the VWR is being updated and the data is to be read from the configuration memory. Due to the large configuration word size, only a few configuration words can be held in the VWR and it has to be updated frequently if the number of loop iterations are small. Hence, whenever the loop size spans over the length of the configuration memory line size (or VWR size), it is easier to simply read the second line from the configuration memory itself. This approach would however be less energy efficient due to a significant number of reads from the larger configuration memory. A bypass 4 from the configuration memory to the loop buffer would in-effect reduce the need for updating the VWR frequently and reduce the number of read accesses to the configuration memory. This alternative to the memory organization is illustrated in FIG. 15.

Another alternative to the aforementioned problem is to introduce a delay cycle internally (without stalling the processor). Now the VWR can be updated every time the loop size extends over the configuration memory line size.

Figure 16:
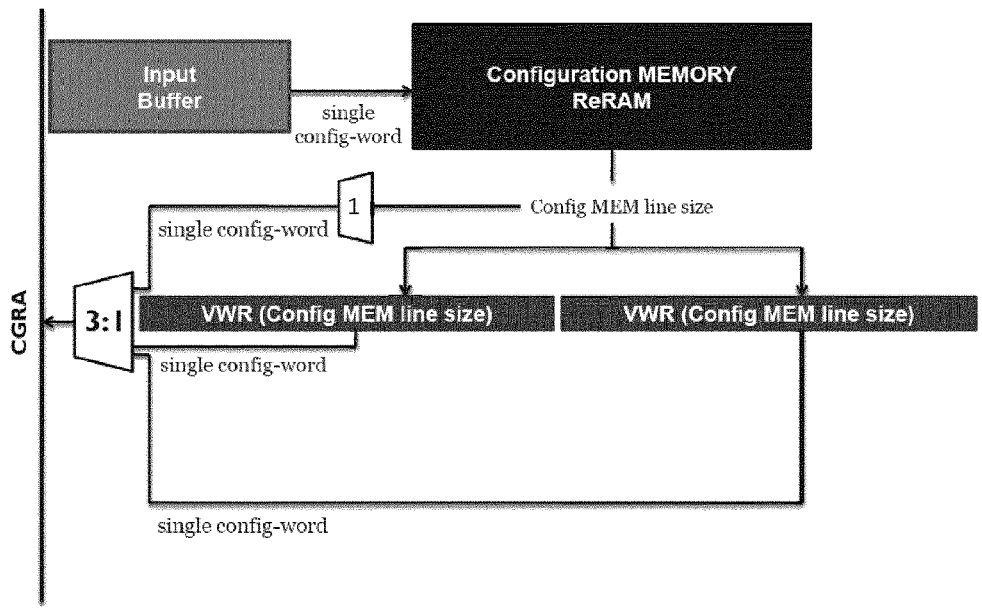
FIG. 16 represents an embodiment of a configuration memory organization with multiple VWRs.

Taking into consideration, the initial D-latch and Flip-Flop based implementation of the configuration cache, it is hard to imagine a ReRAM based loop buffer substitute achieve lower energy consumption (even at extremely lower read access energies). Hence, a further alternative to the memory organization is proposed, wherein the loop buffer is abandoned and another VWR is introduced (FIG. 16). Now, assuming that the number of configuration words in any loop body does not extend over the length of 2 VWRs (16 configuration words), the energy consumption in this case is expected to be the least. This can be attributed to the extremely low energy read access of the VWR and the favorable read access energy of the wide word ReRAM as compared to SRAM. There is an obvious trade-off here with the length of the loop bodies, but in the application domain and for the target platform considered (CGRAs) under consideration, 16 words is a large enough assumption for most loop nests. Moreover, code transformations are always at hand to limit the body size when required.

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. A system comprising:
    a microcomputer comprising a microprocessor unit and a first memory unit, the microprocessor unit comprising at least one functional unit having memory accesses of single words and at least one register, wherein the at least one register is a wide register comprising a plurality of second memory units which are capable to each contain one word, the wide register being adapted so that the plurality of second memory units are simultaneously accessible by the first memory unit, and at least part of the plurality of second memory units are separately accessible by the at least one functional unit, and wherein the first memory unit is an embedded non-volatile memory unit; and
    a compiler for converting application code into execution code adapted for execution on the microcomputer, the compiler comprising:
        means for receiving application code, the application code including memory access operations;
        means for converting the application code such that the memory access operations are translated into irregular and regular memory access patterns;
        read operations comprising simultaneously reading a plurality of words from the first memory unit and simultaneously writing the plurality of words into the at least one register, the at least one register having an asymmetric interface wherein the irregular memory access patterns are dominated by read operations; and
        write operations comprising simultaneously reading a plurality of words from the at least one register and simultaneously writing the plurality of words into the first memory unit, wherein the regular memory access patterns are dominated by write operations,
    wherein a reorganized mapping of array indices for the regular and irregular memory access patterns towards read operations and write operations is performed, and wherein irregular indexing operations are dominating in the read operations and regular indexing operations are dominating in the write operations.

2. The system as in claim 1, wherein the first memory unit is a data memory, and wherein the at least one register and the at least one functional unit are linked to a data bus internal to the microprocessor unit.

3. The system as in claim 1, wherein the first memory unit is an L1 instruction memory.

4. The system as in claim 3, further comprising a loop buffer between the L1 instruction memory and the at least one functional unit.

5. The system as in claim 4, wherein the loop buffer is an embedded non-volatile memory unit.

6. The system as in claim 3, further comprising a loop buffer being an embedded non-volatile memory unit and means for multiplexing arranged for deciding on which memory unit to access.

7. The system as in claim 4, further comprising a single line register between the wide register and the loop buffer.

8. The system as in claim 4, comprising a further wide register adapted for exploiting access from the loop buffer toward the at least one functional unit.

9. The system as in claim 1, wherein the first memory unit is an L1 configuration memory.

10. The system as in claim 9, further comprising a loop buffer being an embedded non-volatile memory unit.

11. The system as in claim 10, wherein the wide register comprises means for multiplexing arranged for deciding on which memory unit to access.

12. The system as in claim 10, further comprising a bypass from the L1 configuration memory to the loop buffer.

13. The system as in claim 10, comprising a further wide register adapted for exploiting access from the loop buffer toward the at least one functional unit.

14. The system as in claim 1, wherein the first memory unit has a divided bit line architecture with non-complementary bit lines.

15. The system as in claim 14, wherein the first memory unit comprises a sense amplifier connected to a first bit line and arranged for providing an amplified voltage swing from the first bit line to a second bit line, the second bit line connected to the plurality of second memory units.

16. The system as in claim 1, wherein the first memory unit is a resistive RAM type memory or a spin transfer torque RAM type.

17. The system as in claim 16, wherein the first memory unit is resistive RAM type memory with one resistor and two transistors.

18. The system as in claim 1, wherein the first memory unit is a hybrid memory structure, further comprising a SRAM memory for use in scalar operations and accesses.

19. The system as in claim 1, wherein the compiler further comprises means for performing a transformation operation to move irregular write operations to a read operation.

* * * * *